(12) United States Patent
Cullen et al.

(10) Patent No.: US 8,212,676 B2
(45) Date of Patent: *Jul. 3, 2012

(54) RFID TAG AND METHOD OF MANUFACTURING THE SAME

(75) Inventors: James M. Cullen, London (CA); Charles K. Herrmann, Cleveland Heights, OH (US); David J. Puleston, Duluth, GA (US)

(73) Assignee: Avery Dennison Corporation, Pasadena, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/804,016

(22) Filed: Jul. 12, 2010

(65) Prior Publication Data

US 2011/0017833 A1    Jan. 27, 2011

Related U.S. Application Data

(63) Continuation of application No. 10/777,456, filed on Feb. 12, 2004, now Pat. No. 7,755,484.

(51) Int. Cl.
  *G08B 13/14* (2006.01)
(52) U.S. Cl. ............ 340/572.1; 340/572.7; 340/572.8
(58) Field of Classification Search .................. None
  See application file for complete search history.

(56) References Cited

U.S. PATENT DOCUMENTS

| | | | |
|---|---|---|---|
| 4,447,479 A * | 5/1984 | Harrison et al. | 428/36.4 |
| 5,859,587 A * | 1/1999 | Alicot et al. | 340/572.8 |
| 6,096,153 A | 8/2000 | Nowaczyk | |
| 6,320,509 B1 * | 11/2001 | Brady et al. | 340/572.7 |
| 6,371,187 B1 * | 4/2002 | Nowaczyk | 156/511 |
| 6,451,154 B1 * | 9/2002 | Grabau et al. | 156/300 |
| 6,940,408 B2 * | 9/2005 | Ferguson et al. | 340/572.7 |
| 6,951,596 B2 * | 10/2005 | Green et al. | 156/264 |
| 7,183,993 B2 * | 2/2007 | Dai et al. | 343/795 |
| 7,233,498 B2 * | 6/2007 | Kerr et al. | 361/737 |
| 2001/0014377 A1 * | 8/2001 | Babb et al. | 428/40.1 |
| 2003/0057279 A1 * | 3/2003 | Uozumi et al. | 235/451 |
| 2003/0117336 A1 | 6/2003 | Droz | |
| 2004/0062016 A1 * | 4/2004 | Kerr et al. | 361/761 |
| 2005/0252605 A1 * | 11/2005 | Green et al. | 156/264 |

FOREIGN PATENT DOCUMENTS

FR    2793577 A1    11/2000

* cited by examiner

*Primary Examiner* — Julie Lieu
(74) *Attorney, Agent, or Firm* — Kriegsman & Kriegsman

(57) ABSTRACT

A radio frequency identification (RFID) tag and method of manufacturing the same. In a preferred embodiment, the RFID tag includes a radio frequency (RF) inlay, the RF inlay including a carrier sheet, an antenna printed on the carrier sheet and a wireless communication device bonded to the antenna. The RFID tag also includes a plastic extrudate, the RF inlay being disposed within the extrudate so that the antenna and the wireless communication device are encapsulated on all sides within the extrudate. Optional metallic reflector and mounting adhesive layers may be laminated onto the underside of the extrudate. The present invention is also directed to an automated method for manufacturing the above RFID tag, such a method involving, in one embodiment, feeding a continuous supply of RF inlays into a crosshead extruder to yield a continuously extruded block and then cutting the block between successive antennae to yield a plurality of individual RFID tags.

21 Claims, 11 Drawing Sheets

RFID TAG AND METHOD OF MANUFACTURING THE SAME

CROSS-REFERENCE TO RELATED APPLICATIONS

The present application is a continuation of U.S. patent application Ser. No. 10/777,456, inventors Cullen et al., filed Feb. 12, 2004, now U.S. Pat. No. 7,755,484 the disclosure of which is incorporated herein by reference.

BACKGROUND OF THE INVENTION

The present invention relates generally to wireless communication devices and more particularly to a novel radio frequency identification (RFID) tag and to a method of manufacturing said RFID tag.

Current inventory and manufacturing methods rely on the ability to track and identify items, such as packages, containers, individual parts, inventory items or other similar items of concern, and to communicate information relating to said items in a wireless manner. One method of tracking and providing information relating to an item is to incorporate a wireless communication device, such as an active or passive transponder, into an identification tag that responds to wireless interrogation and commands and, in turn, to attach said identification tag directly to the item. The tag is preferably designed to store or represent pertinent information relating to the item to which it is attached, such as a unique identifying number, an expiration date, a "born on" date, manufacturing information, shipment status and the like.

A radio frequency identification (RFID) tag is one well-known type of wireless communication device which transmits and/or receives information relating to an item using radio frequency (RF) signals.

One well-known type of RFID tag includes an antenna and an integrated circuit (IC) chip mounted on the antenna. The aforementioned components are typically enclosed within a two-piece plastic housing or package. In operation, the IC chip is programmed to store pertinent information relating to the item to which the RFID tag is secured. In response to an appropriate interrogation signal, the IC chip converts said programmed information into a corresponding electromagnetic signal which is propagated as radio frequency (RF) waves by the antenna.

Although RFID tags of the type described above are suitable for use on many different types of items, such tags are not well-suited for use on metallic items for the reason that metallic items tend to interfere with the RF signal transmitted by the RFID tag antenna.

Accordingly, one approach to remedy this problem has been to provide the RFID tag with a metallic reflector which makes the RFID tag more tolerant of nearby metals while retaining its RF functionality. Specifically, a metallic reflector is secured to the outer surface of the plastic package housing the antenna and IC chip. In use, the metallic reflector functions as an electrically conductive back plane which reflects RF signals transmitted by the RFID tag antenna away from the metal item to which the RFID tag is secured. In this respect, the metallic reflector serves to effectively insulate the RFID tag from the metal object to which it is secured, which is highly desirable.

An example of an RFID tag of the aforementioned type is disclosed in U.S. Pat. No. 6,501,435, inventors King et al., which issued Dec. 31, 2002, and which is incorporated herein by reference.

RFID tags having a metallic reflector are commonly manufactured in the following manner. First, using injection molding, a plastic base and a plastic cover for the RFID tag package are separately formed, the base and/or the cover being appropriately contoured to matingly receive the RFID tag package. After said injection molding step, the RFID tag antenna, which is commonly constructed as a thin strip of etched copper foil, is secured to the top surface of the plastic base. It should be noted that, rather than securing the antenna to the base in a separate step, the plastic base may, in the alternative, be injection molded around the antenna. Either immediately prior to or immediate after the antenna is secured to the base, the IC chip for the RFID tag is soldered to the top surface of the antenna. With the antenna and IC chip coupled to the base, the plastic cover is then sonic-welded, by hand, to the top of the plastic base so as to enclose the antenna and IC chip therebetween. In a final step, the metallic reflector is secured to the bottom surface of the base using an adhesive.

RFID tags manufactured in the method described above suffer from a couple of notable shortcomings.

One such shortcoming of the foregoing approach is that the molds used to make the injection molded base and cover are typically only sized for use with an antenna (and IC chip) of a particular size. Consequently, if one wishes to vary the dimensions of the antenna (e.g., to tune the antenna for different applications), one must obtain new molds for manufacturing the base and cover. This is highly undesirable as molds are quite expensive.

Another shortcoming of the foregoing approach is the low throughput of the process for manufacturing and assembling the tag. As noted above, each tag is manufactured, one at a time, using a labor-intensive and time-consuming process.

SUMMARY OF THE INVENTION

It is an object of the present invention to provide a new radio frequency identification (RFID) tag and method of manufacturing the same.

It is another object of the present invention to provide an RFID tag and method of manufacturing the same that overcome at least some of the shortcomings associated with existing RFID tags and their methods of being manufactured.

It is yet another object of the present invention to provide an RFID tag and method of manufacturing the same that is well-suited for mass-production at a high rate of throughput.

According to one aspect of the present invention, there is provided a tag comprising (a) an inlay, said inlay comprising (i) an antenna, and (ii) a wireless communication device coupled to said antenna; and (b) a plastic extrudate, said plastic extrudate encapsulating said antenna and said wireless communication device.

According to another aspect of the present invention, there is provided a tag comprising (a) a plastic casing comprising (i) a bottom member shaped to define a longitudinal cavity and (ii) a top member applied to said bottom member to at least partially enclose the longitudinal cavity, and (b) an inlay disposed within the longitudinal cavity, said inlay comprising, (i) a carrier sheet, (ii) an antenna disposed on said carrier sheet, and (iii) a wireless communication device coupled to said antenna.

According to yet another aspect of the present invention, there is provided a method of continuously manufacturing a plurality of tags, each tag comprising a plastic extrudate and an inlay surrounded by said plastic extrudate, said method comprising the steps of (a) providing a continuous supply of inlays, said continuous supply of inlays comprising a continuous carrier web, a plurality of antennae positioned on said continuous carrier web at spaced intervals and a wireless communication device coupled to each of said antennae, (b) feeding said continuous supply of inlays into a cross-head extruder so as to yield a continuous block which includes said continuous supply of inlays surrounded by a plastic extrudate, and (c) cutting said continuous block between successive antennae so as to yield individual tags.

According to still another aspect of the present invention, there is provided a method of continuously manufacturing a plurality of tags, said method comprising the steps of (a) providing a single continuous strip which is shaped to include a continuous longitudinal cavity along its entire length, (b) depositing a continuous supply of inlays into the continuous longitudinal cavity, said continuous supply of inlays comprising a carrier web, a plurality of antennae disposed on said carrier web at spaced intervals, and a wireless communication device coupled to each of said antennae, (c) applying a cover over said continuous supply of inlays disposed within said single continuous strip, and (d) cutting said cover, said continuous supply of inlays and said single continuous strip between successive antennae to yield individual tags.

According to still yet another aspect of the present invention, there is provided a method of continuously manufacturing a plurality of tags, each tag comprising a plastic casing and an inlay encased within said plastic casing, said method comprising the steps of (a) providing a single continuous strip having a plurality of cavities at spaced intervals, (b) depositing an inlay within each cavity in said single continuous strip, each inlay comprising a carrier sheet, an antenna disposed on said carrier sheet and a wireless communication device coupled to said antenna, (c) applying a single continuous web to said single continuous sheet to enclose each inlay within its corresponding cavity, and (d) cutting said single continuous strip and said single continuous web between successive cavities to yield individual tags.

According to a further aspect of the present invention, there is provided a method of continuously manufacturing a plurality of tags, each tag comprising a plastic casing and an inlay encased within said plastic casing, said method comprising the steps of (a) providing a single continuous member having a plurality of cavities at spaced intervals, (b) depositing an inlay within each cavity in said single continuous strip, each inlay comprising a carrier sheet, an antenna disposed on said carrier sheet and a wireless communication device coupled to said antenna, (c) applying a plug over each inlay to enclose said inlay within its corresponding cavity, and (d) cutting said single continuous strip between successive cavities.

The present invention is also directed to a continuous supply of inlays, said continuous supply of inlays comprising (a) a continuous web, (b) a plurality of antennae disposed on the top surface of said continuous web at spaced intervals, and (c) a plurality of wireless communication devices, each wireless communication device being coupled to a corresponding antenna.

Various other features and advantages will appear from the description to follow. In the description, reference is made to the accompanying drawings which form a part thereof, and in which is shown by way of illustration, various embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts.

DETAILED DESCRIPTION OF THE PREFERRED EMBODIMENT

Figure 1:
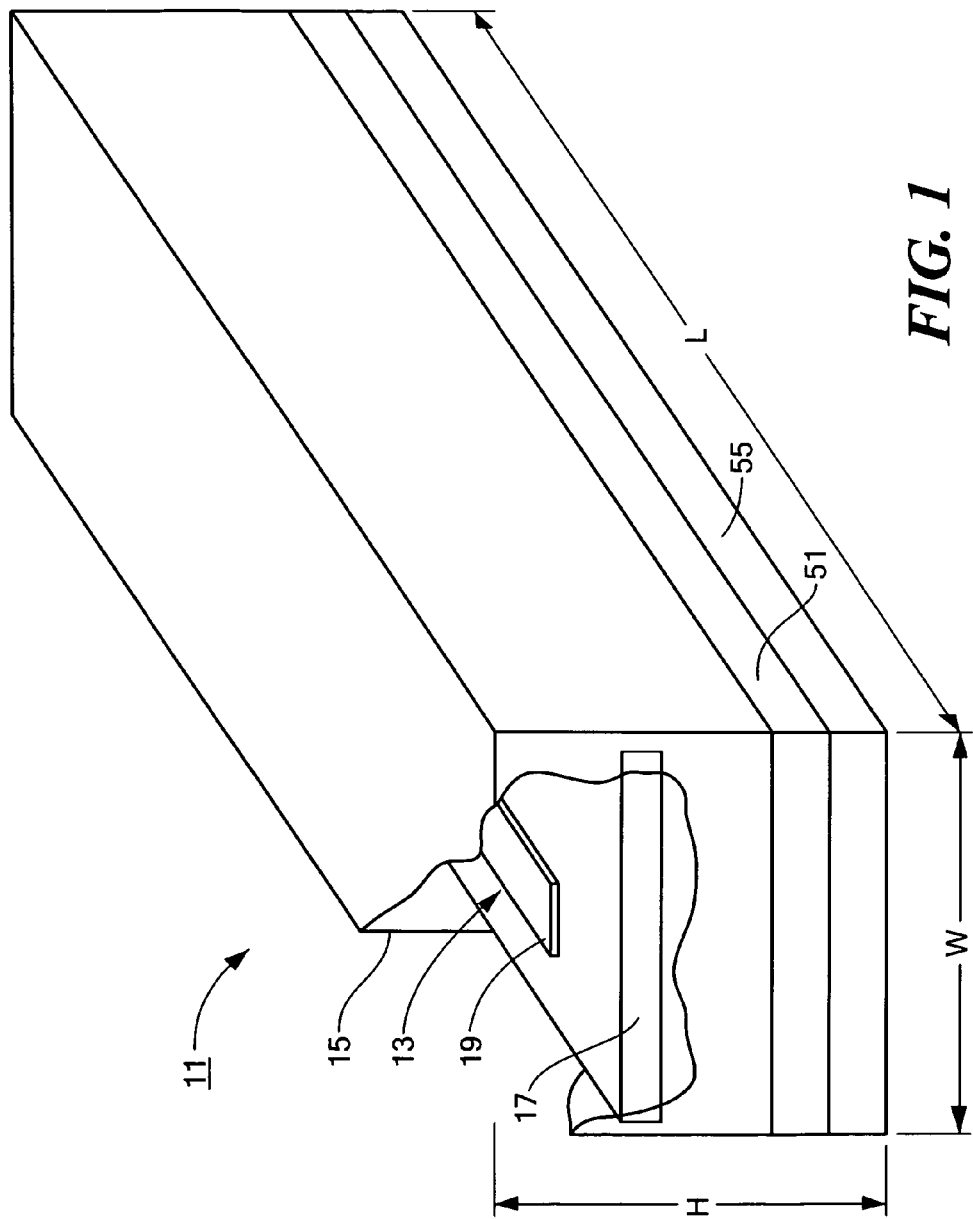
FIG. 1 is a perspective view of a first embodiment of a radio frequency identification (RFID) tag constructed according to the teachings of the present invention, said tag being broken away in part to more clearly show the carrier sheet and antenna of the RF inlay.
Figure 2:
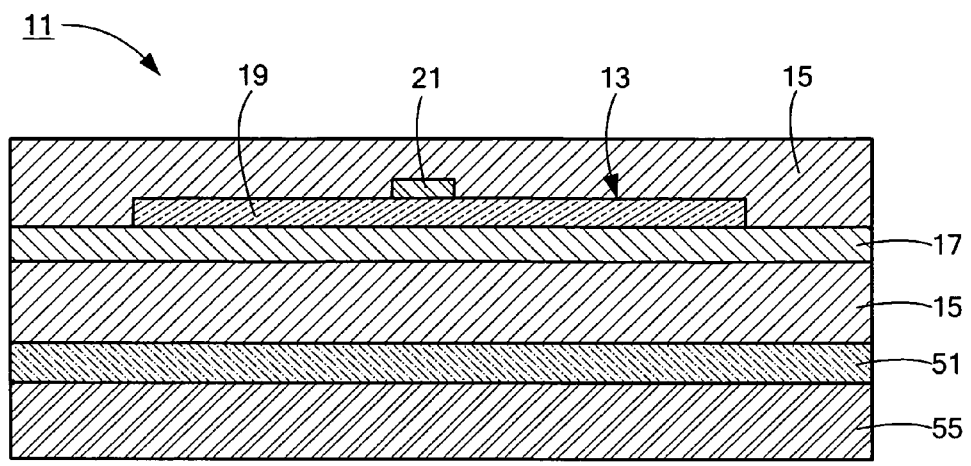
FIG. 2 is a longitudinal section view of the RFID tag shown in FIG. 1.

Referring now to FIGS. 1 and 2, there are shown perspective and section views, respectively, of a first embodiment of a radio frequency identification (RFID) tag constructed according to the teachings of the present invention and identified generally by reference numeral 11. In operation, RFID tag 11 is designed to be affixed onto a particular item (or packaging therefor) and, in response to an active or passive radio frequency signal, wirelessly transmit information relating to said item.

RFID tag 11 comprises a radio frequency (RF) inlay 13 and a plastic extrudate 15, extrudate 15 surrounding or enveloping inlay 13 in the manner to be described below.

RF inlay 13 includes a carrier sheet 17, an antenna 19 formed on carrier sheet 17 and a wireless communication device 21 mounted on antenna 19.

Carrier sheet 17 preferably comprises a heat-stable polymeric film having a thickness in the range of about 2 mm to 5 mm. Examples of materials suitable for use as carrier sheet 17 include, but are not limited to, polyester films, polyethylene terephthalate (PET) films and polyimide films (such as Kapton® polyimide film, which is commercially available from E.I. DuPont de Nemours and Company Corporation, Wilmington, Del.). Carrier sheet 17 is preferably manufactured as a continuous web which can be wound into roll form, as will be described further below.

Antenna 19 preferably comprises a conductive material (e.g., copper or silver) of appropriate size and shape, which is printed directly onto the top surface of carrier sheet 17. Preferably, antenna 19 is formed by depositing a layer of the conductive material onto carrier sheet 17, laying a template over the layer of conductive material and then etching away portions of the conductive material (e.g., using an acid bath) in order to leave remaining the desired shape of antenna 19. Alternatively, antenna 19 may be formed by printing a conductive ink in a desired pattern directly onto carrier sheet 17.

Figure 3:
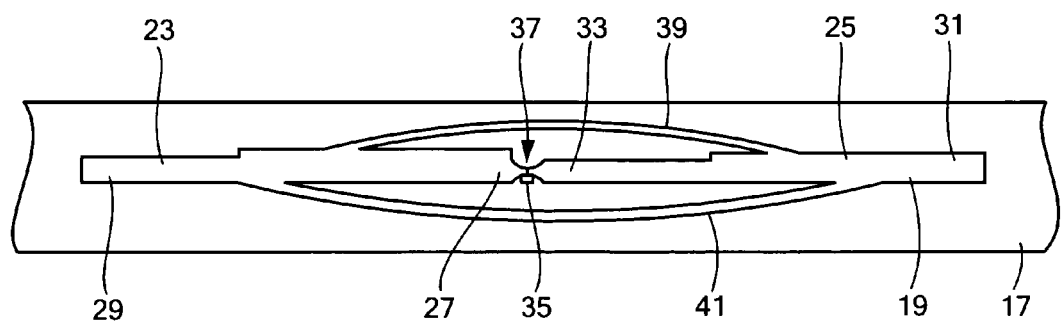
FIG. 3 is an enlarged, fragmentary, top plan view of the RF inlay antenna shown in FIG. 2, the RF inlay being shown with the wireless communication device removed therefrom.

Referring now to FIG. 3, there is shown an enlarged, fragmentary, top plan view of antenna 19 printed on carrier sheet 17. Antenna 19 is preferably in the form of a bilaterally symmetrical dipole antenna which includes first and second conductive tabs 23 and 25, respectively, which are substantially identical in shape. First conductive tab 23 includes a first end 27 and a second end 29. Similarly, second conductive tab 25 includes a first end 31 and a second end 33. Tabs 23 and 25 are linearly arranged in an end-to-end relationship with first end 27 of first tab 23 and second end 33 of second tab 25 spaced slightly apart from one another. A small, square-shaped conductive pad 35 is disposed in proximity to, but spaced apart from, first end 27 of first tab 23 and second end 33 of second tab 25. Together, first end 27 of first tab 23, second end 33 of second tab 25 and pad 35 define a landing area 37 on which wireless communication device 21 is conductively bonded. Antenna 19 further comprises a pair of arcuate inductors 39 and 41 which connect first tab 23 to second tab 25, inductors 39 and 41 being disposed on opposite sides of landing area 35. In operation, inductors 39 and 41 create a level of inductance across the wireless communication device 21 bonded to landing area 35, thereby enabling the wireless communication device 21 to operate at its peak performance.

Additional information pertaining to antenna 19 may be found in one or more of the following commonly-assigned U.S. patent applications, all of which are incorporated herein by reference: U.S. patent application Ser. No. 10/410,252, inventor Forster, filed Apr. 10, 2003; U.S. Provisional Patent Application Ser. No. 60/517,148, inventors Power et al., filed Nov. 4, 2003; and U.S. Provisional Patent Application Ser. No. 60/517,156, inventors Power et al., filed Nov. 4, 2003.

It should be understood that, although, in the present embodiment, antenna 19 is preferably a straight, center-fed, one-half wavelength, symmetric, dipole antenna, antenna 19 could be replaced with other types of antennae, such as conventional antennae (e.g., a monopole antenna), without departing from the spirit of the present invention.

Wireless communication device 21 is preferably in the form of an integrated circuit (IC) chip which is mounted on antenna 19. Wireless communication device 21 is conductively bonded to landing surface 37 of antenna 19 by any conventional means, such as through a soldering process or through the use of a conductive adhesive. In this manner, a conductive path is established between wireless communication device 21 and antenna 19.

Wireless communication device 21 represents any conventional device which, in response to an active or passive radio frequency signal, wirelessly transmits information relating to the particular item to which RFID tag 11 is affixed. Preferably, wireless communication device 21 is capable of transmitting signals at multiple resonant frequencies.

As noted above, carrier sheet 17 is preferably manufactured as an elongated web, which enables a plurality of RF inlays 13 to be constructed using a common sheet 17. Specifically, a plurality of antennae 19 are preferably printed on carrier sheet 17 at spaced intervals (e.g., between ¼ inch and ½ inch apart), each antenna 19 having a corresponding wireless communication device 21 mounted thereon. In this manner, a plurality of interconnected RF inlays 13 may be created which may then, in turn, be wound into an RF inlay supply roll.

Figure 4:
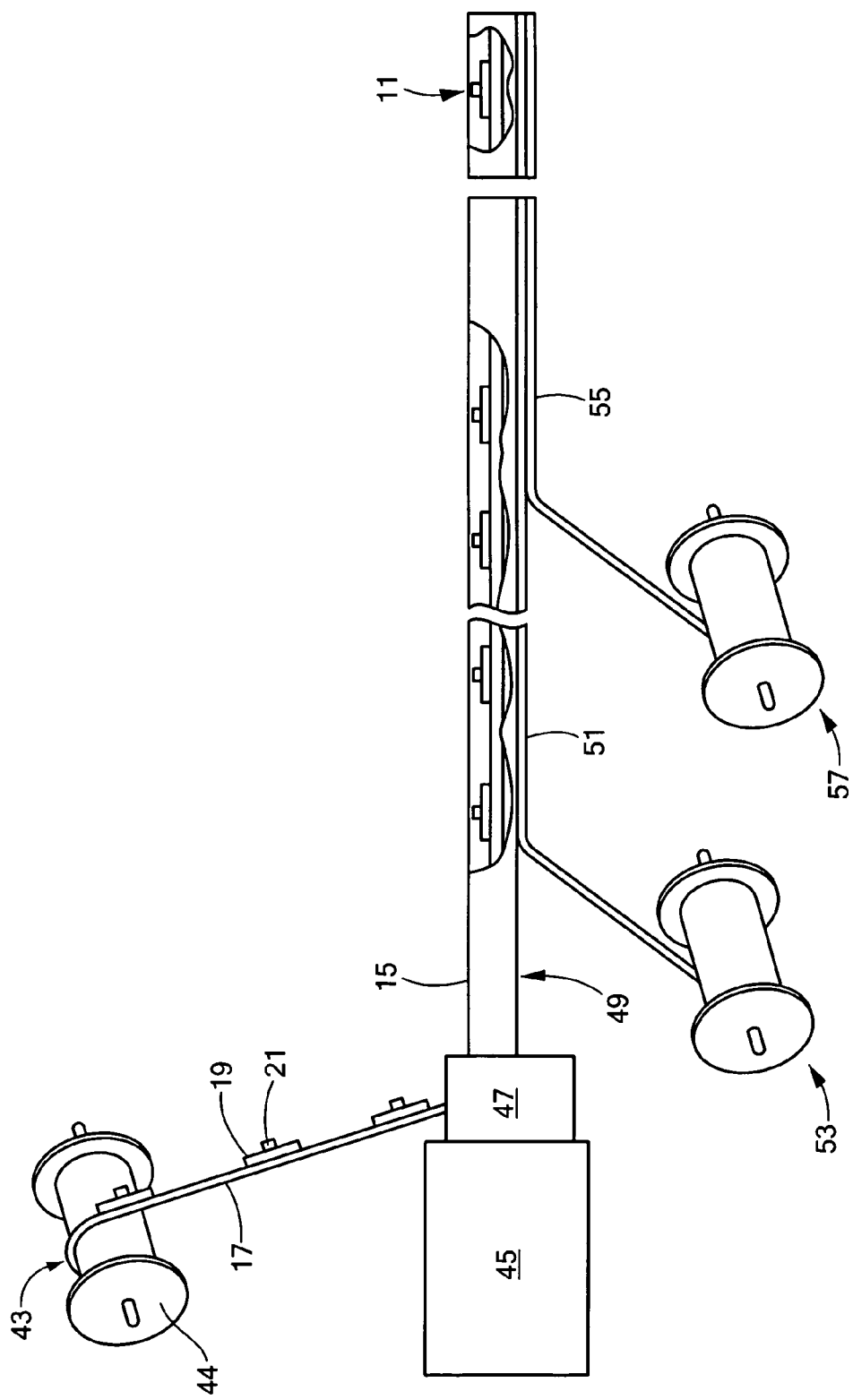
FIG. 4 is a fragmentary, simplified, schematic view of an automated method for continuously manufacturing a supply of the RFID tags shown in FIG. 1.

Referring now to FIG. 4, there is shown a simplified schematic representation of an automated method for continuously manufacturing a supply of RFID tags 11. In the manufacturing process, a plurality of interconnected inlays 13 in the form of an RF inlay supply roll 43 are introduced from a reel 44 into a cross-head extruder 45. Specifically, cross-head extruder 45 is equipped with a die head 47, die head 47 being provided with a slot (not shown). RF inlay supply roll 43 is fed directly into die head 47 through the aforementioned slot. As extruder 45 generates heat, resin previously deposited into extruder 45 in pellet form begins to melt. The molten plastic in turn coaxially surrounds or envelopes the portion of supply roll 43 which has been introduced into die head 47. Extruder 45 then forces the molten thermoplastic material out through die head 47 in a linear fashion to yield a continuously extruded block 49, block 49 comprising plastic extrudate 15 and supply roll 43, with antenna 19 and wireless communication device 21 of each RF inlay 13 being encapsulated on all sides within extrudate 15. Continuous block 49 is preferably transported away from cross-head extruder 45 by means of a linear conveyor belt (not shown).

It should be noted that plastic extrudate 15 preferably comprises a durable, thermoplastic material including, but not limited to, a rigid polyvinyl chloride (PVC), a polyester, a polycarbonate, a polyethylene or a polypropylene, which can be molded into a rectangular block shape.

After the extrusion process, a metallic reflector 51 is laminated onto the bottom surface of block 49, preferably using a heat-activatable adhesive. The purpose of metallic reflector 51 is to reflect RF signals generated by RF inlay 13 away from a metallic item to which RFID tag 11 is secured, thereby effectively insulating RF inlay 13 from the metallic item. Examples of suitable metals for use as metallic reflector 51 include aluminum and/or copper. Preferably, metallic reflector 51 is manufactured as a continuous sheet or strip of metal, said continuous strip being wound onto a supply reel 53. In this manner, metallic reflector 51 can be continuously unwound from supply reel 53 and laminated to the underside of block of thermoplastic material 49 to allow for the continuous assembly of RFID tags 11.

It should be noted that the application of metallic reflector 51 to the underside of block 49 is optional and is only preferred when the item to which RFID tag 11 is to be secured is metallic in nature. As a result, metallic reflector 51 could be eliminated entirely from the assembly process.

It should be noted that, by modifying extruder die head 47 to include a second slot, metallic reflector 51 may also be fed into die head 47 and simultaneously surrounded within plastic extrudate 15 with inlay 13 during the extrusion process.

After lamination of metallic reflector 51 onto block 49, the resulting laminate is preferably advanced to a cooling station (not shown). At the cooling station, the laminate is passed through a water bath (not shown) approximately 15-20 feet long in order to fix, or set, the shape of plastic extrudate 15.

A mounting adhesive 55 may be laminated onto the bottom surface of metallic reflector 51 so that tag 11 may be adhesively mounted onto a desired article. Preferably, adhesive 55 is manufactured as a continuous sheet or strip, said continuous strip being wound onto a supply reel 57. In this manner, adhesive 55 can be continuously unwound from reel 57 and secured to the underside of metallic reflector 51.

It should be noted that, where it is not necessary or desirable to adhesively mount tag 11 onto an article, adhesive 55 is not needed and the application of mounting adhesive 55 onto the underside of metallic reflector 51 may be eliminated from the assembly process.

In the final step of the assembly process, continuous block 49 (along with any reflectors 51 and adhesives 55 affixed thereto) is cut, as required, to form the individual RFID tags 11. It should be noted that sensors (not shown) may be positioned along the linear conveyor belt to locate antennae 19 within block 49 so that block 49 may be cut between adjacent antennae 19, as opposed to being cut within an antenna 19. Individual RFID tags 11 severed from block 49 can be packaged and/or shipped, as deemed necessary. The cut edges could be sealed using techniques, such as heat-crimping, application of a sealant or application of a suitable solvent.

It should be noted that, in an optional step prior to said cutting step, continuous block 49 (along with any reflectors 51 and adhesives 55 affixed thereto) may be crimped between adjacent antennae 19.

Without wishing to limit the invention in any conceivable way to any particular embodiment of the invention, the present inventors hereby disclose the following preferred dimensions of RFID tag 11: RFID tag 11 preferably has a height H (excluding adhesive 55) of approximately 5 mm, a length L of approximately 150 mm, and a width W of approximately 22 mm.

It should be noted that numerous variations could be made to RFID tag 11 (and its corresponding assembly process) without departing from the spirit of the present invention.

Figure 5:
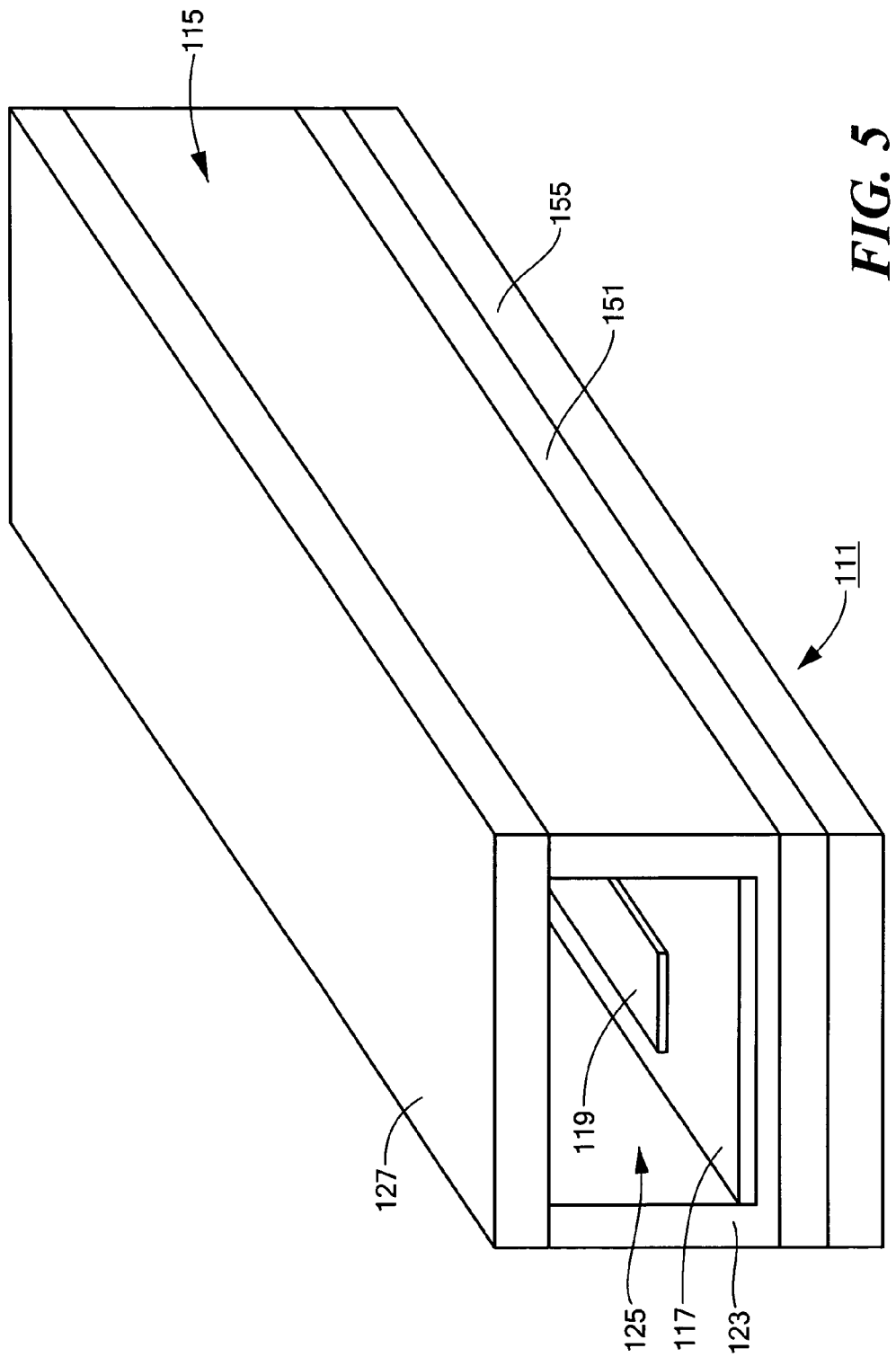
FIG. 5 is a perspective view of a second embodiment of an RFID tag constructed according to the teachings of the present invention.
Figure 6:
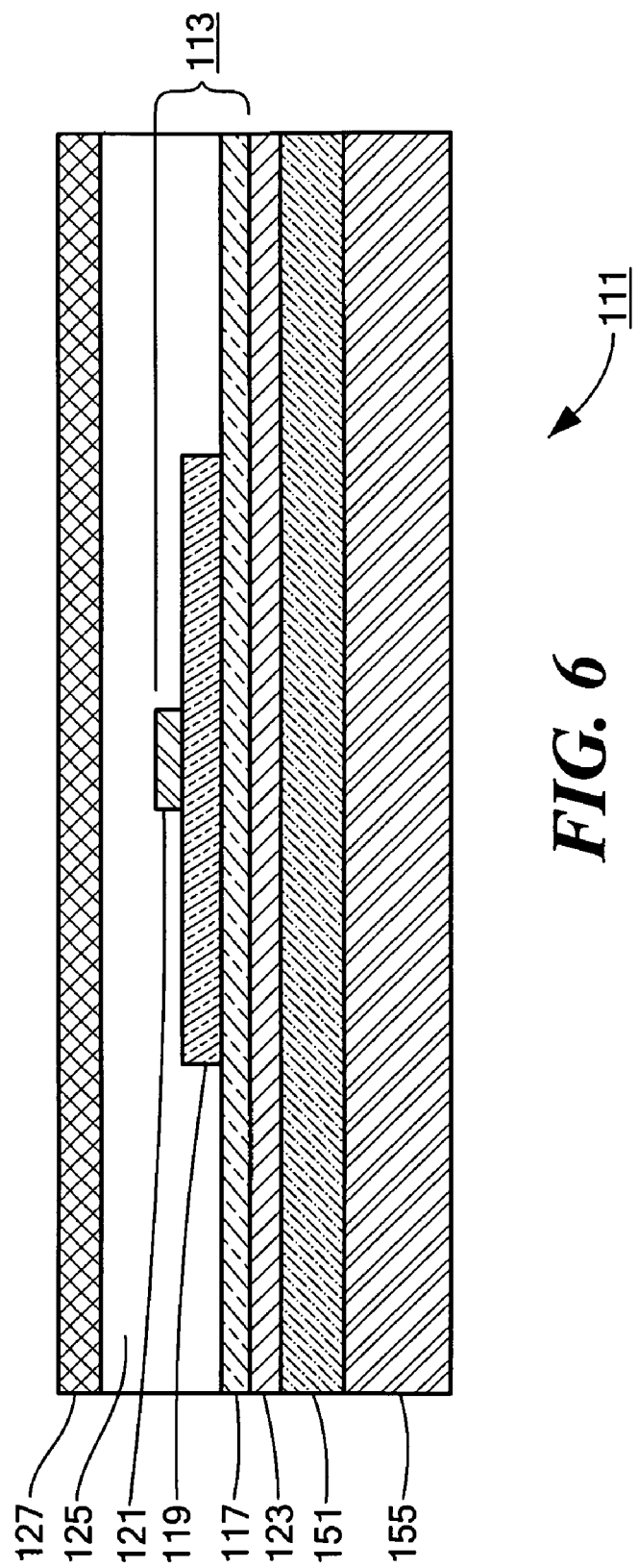
FIG. 6 is a longitudinal section view of the RFID tag shown in FIG. 5.

As an example, referring now to FIGS. 5 and 6, there are shown perspective and section views, respectively, of a second embodiment of a radio frequency identification (RFID) tag constructed according to the teachings of the present invention and identified generally by reference numeral 111.

RFID tag 111 is similar to RFID tag 11 in that RFID tag 111 includes a radio frequency (RF) inlay 113 which is identical to RF inlay 13. Specifically, RF inlay 113 comprises an elongated carrier sheet 117 preferably manufactured as a continuous web of heat-stable polymeric film, an antenna 119 printed directly onto the top surface of carrier sheet 117 and a wireless communication device 121 conductively bonded to antenna 119.

However, RFID tag 111 differs from RFID tag 11 in that RF inlay 113 is positioned within a two-piece plastic casing 115 whereas RF inlay 13 is positioned within a unitary plastic extrudate 15.

Specifically, casing 115 includes an elongated bottom member 123 which is manufactured out of plastic. Bottom member 123 is preferably shaped to have a corrugated type of construction, bottom member 123 being U-shaped in lateral cross-section along its length so as to define a longitudinal rectangular cavity 125 therewithin. It should be noted that bottom member 123 is uniform in cross-section with cavity 125 extending its entire length. Preferably, bottom member 123 is formed in one step through an extrusion process.

Cavity 125 is sized and shaped to receive RF inlay 113. After RF inlay 113 has been placed within cavity 125 of bottom member 123, an elongated top member 127 is applied to bottom member 123 so as to substantially enclose longitudinal cavity 125 along its length with antenna 119 and wireless communication device 121 positioned therewithin. (It should be noted that a small space or air gap exists between inlay 113 and top member 127.) Top member 127 is preferably formed through an extrusion process.

In order to fully enclose antenna 119 and wireless communication device 121 within longitudinal cavity 125, the free ends of two-piece casing 115 are preferably crimped. However, it should be noted that casing 115 is not represented in the drawings as being crimped at its ends for simplicity purposes only.

Like RFID tag 11, RFID tag 111 may include a metallic reflector 151 which is laminated onto the underside of bottom member 123 and/or a mounting adhesive 155 which is laminated onto the underside of metallic reflector 151. It should be noted that the application of metallic reflector 151 to the underside of bottom member 123 is optional and is only preferred when the item to which RFID tag 111 is to be secured is metallic in nature. Furthermore, it should be noted that, where it is not necessary or desirable to adhesively mount tag 111 onto an article, adhesive 155 is not needed and the application of mounting adhesive 155 onto the underside of metallic reflector 151 may be eliminated from the assembly process.

Figure 7:
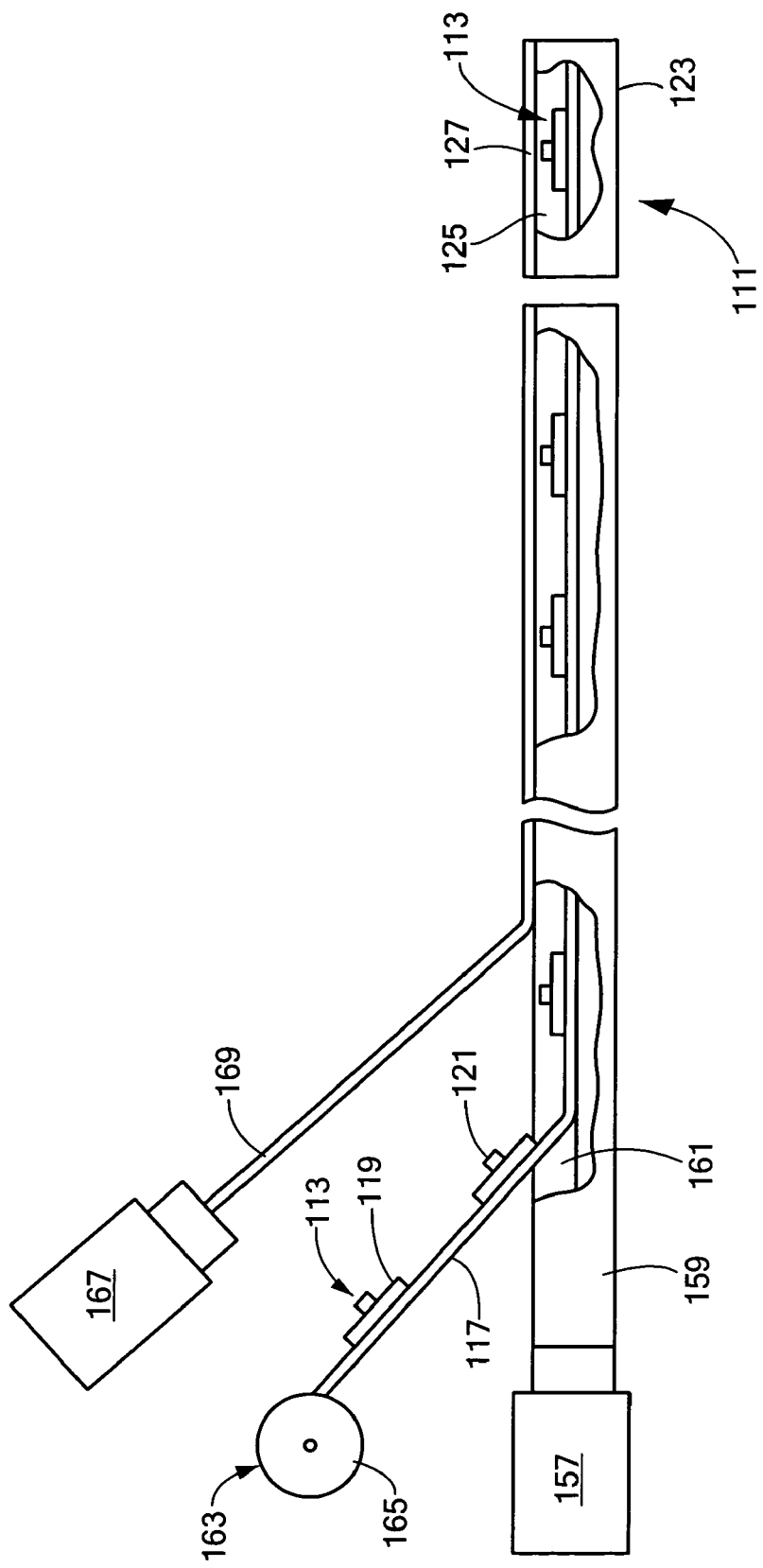
FIG. 7 is a simplified schematic view of an automated method for continuously manufacturing a supply of the RFID tags shown in FIG. 5.

Referring now to FIG. 7, there is shown a simplified schematic representation of an automated method for continuously manufacturing a supply of RFID tags 111. For simplicity purposes only, the continuous supply of RFID tags 111 is shown without metallic reflector 151 and adhesive 155. However, it is to be understood that metallic reflector 151 and adhesive 155 could be introduced into the automated process in the same manner in which reflector 51 and adhesive 55 were introduced into the above-described method of manufacturing RFID tags 11.

In the process for manufacturing RFID tags 111, an extruder 157 generates a continuous extrudate strip 159 which has a uniform, U-shaped lateral cross-section along its length. As a result, continuous strip 159 defines a continuous longitudinal cavity 161. It should be noted that continuous strip 159 can be cut (in a later step to be described further below) to generate a plurality of bottom members 123. A plurality of interconnected inlays 113 produced in the form of an RF inlay supply roll 163 are introduced from a reel 165 into elongated cavity 161.

With the plurality of interconnected inlays 113 deposited in-line within cavity 161, a secondary extruder 167 generates a continuous plastic web 169 which is applied in-line to the top of strip 159. It should be noted that web 169 can be cut (in a later step to be described further below) to generate a plurality of top members 127. Web 169 is brought together with continuous strip 159 to substantially enclose interconnected RF inlays 113 within cavity 161.

It should be noted that web 169 may be affixed to strip 159 using any one of a variety of different methods. As an example, web 169 may be hot when applied to strip 159 to promote the adhesion therebetween. As another example, web 169 may be cool when initially applied to strip 159 but then subsequently heated after said application step to promote the adhesion therebetween. As another example, web 169 may be affixed to strip 159 using a conventional adhesive.

In the final steps of the assembly process, the continuous strip 159 and web 169 (along with any reflectors 151 and adhesives 155 affixed thereto) are crimped between adjacent antennae 119 to fully enclose each antenna 119 and wireless communication device 121 within cavity 161. After the crimping process, the continuous strip 159 and web 169 (along with any reflectors 151 and adhesives 155 affixed thereto) are cut between adjacent antennae 119 to form the individual RFID tags 111. Sensors (not shown) located along the continuous assembly line may be used to locate antennae 119 within cavity 161 during the crimping and cutting processes.

It should be noted that, although the process for fabricating tag 111 as described above includes, among other things, affixing web 169 to strip 159 and then cutting the resulting assembly into individual tags, one could first cut strip 159 and web 169 into respective pluralities of individual bottom members 123 and individual top members 127 and then affix the individual top members 127 to the individual bottom members 123.

Figure 8:
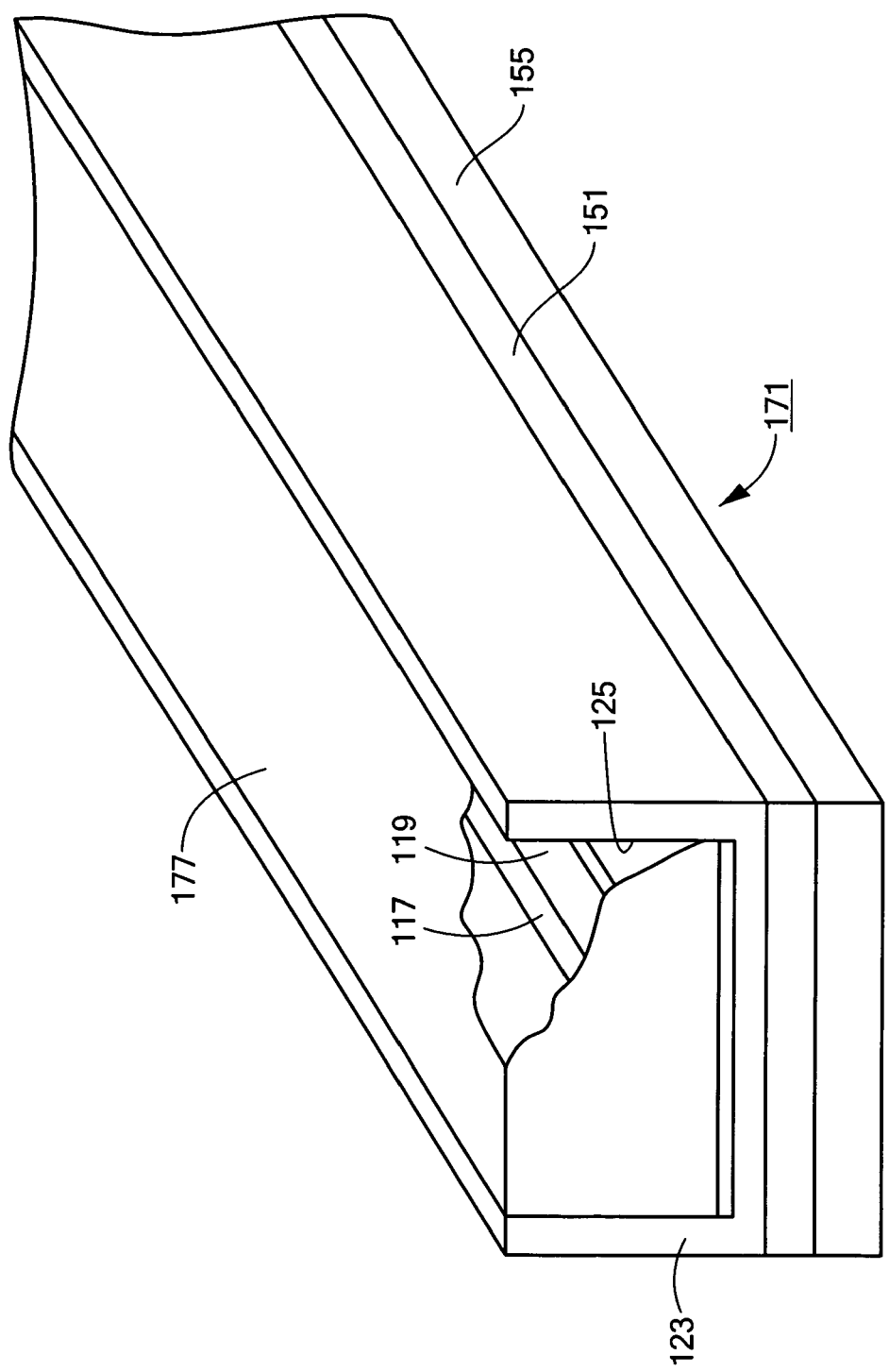
FIG. 8 is a perspective view of a third embodiment of an RFID tag constructed according to the teachings of the present invention, said tag being broken away in part to more clearly show the carrier sheet and antenna of the RF inlay.
Figure 9:
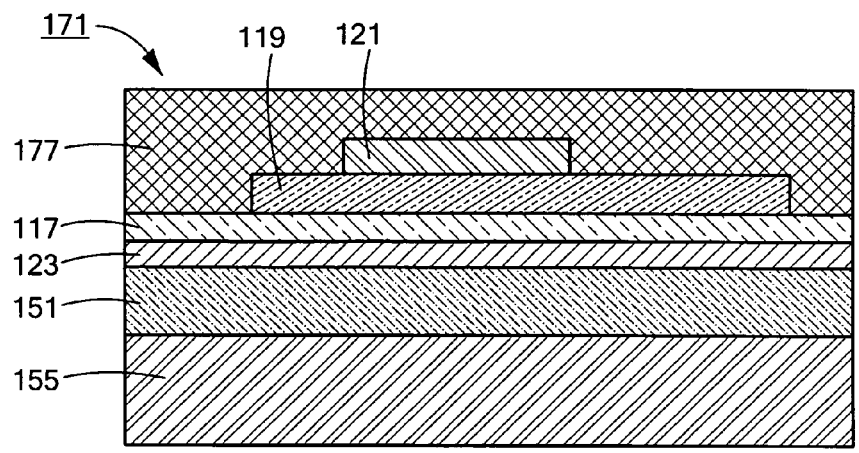
FIG. 9 is a longitudinal section view of the RFID tag shown in FIG. 8.

Referring now to FIGS. 8 and 9, there are shown perspective and section views, respectively, of a third embodiment of a radio frequency identification (RFID) tag constructed according to the teachings of the present invention and identified generally by reference numeral 171.

Tag 171 is similar in most respects to tag 111, the principal difference between the two tags being that tag 171 does not include a top member 127. Instead, tag 171 includes a plug 177, plug 177 being positioned directly on top of inlay 113 and occupying some or all of the remaining space of cavity 125 of bottom member 123. Accordingly, as can readily be appreciated, tag 171 does not possess an air gap over inlay 113 of the type described above in connection with tag 111.

Plug 177 may be formed, for example, by extruding molten plastic over inlay 113 until cavity 125 is partially or completely filled and then allowing the molten plastic to cool and harden in place. Alternatively, plug 177 may be formed by pouring into cavity 125 a suitable non-molten polymer and causing or allowing such a polymer to solidify in place. Examples of such polymers include (i) emulsion-based or solvent-borne polymers and (ii) curable polymers including, but not limited to, two-part polymers (such as two-part epoxies), photo-curable polymers, and air-curable polymers.

It should be noted that plug 177 may be formed prior to the cutting of strip 159 into individual bottom members 123 or after the cutting of strip 159 into individual bottom members 123.

Figure 10:
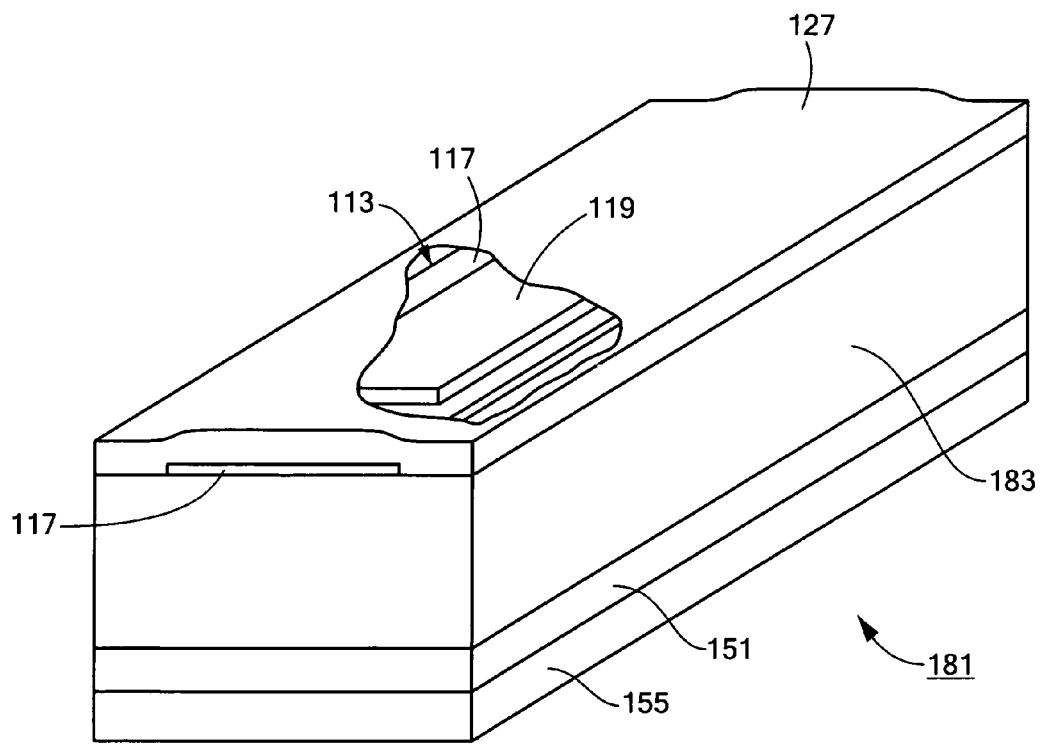
FIG. 10 is a perspective view of a fourth embodiment of an RFID tag constructed according to the teachings of the present invention, said tag being broken away in part to more clearly show the carrier sheet and antenna of the RF inlay.

Referring now to FIG. 10, there is shown a perspective view of a fourth embodiment of a radio frequency identification (RFID) tag constructed according to the teachings of the present invention, said RFID tag being identified generally by reference numeral 181.

Tag 181 is similar in most respects to tag 111, the principal difference between the two tags being that tag 181 does not include a trough-shaped bottom member 123, but rather, includes a rectangular prismatic bottom member 183, inlay 113 being sandwiched between bottom member 183 and top member 127.

Figure 11:
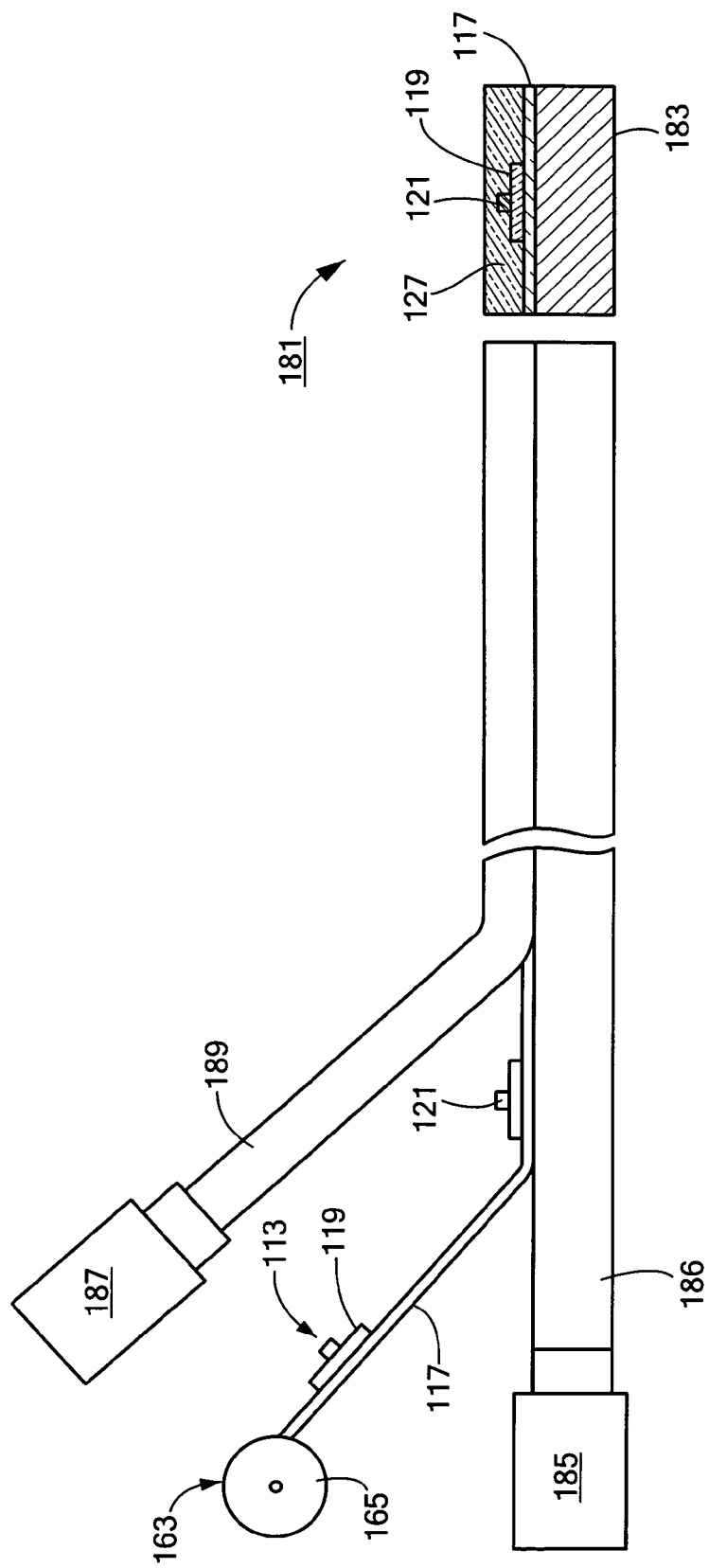
FIG. 11 is a simplified schematic view, shown partly in section, of an automated method for continuously manufacturing a supply of the RFID tags shown in FIG. 10.

Referring now to FIG. 11, there is shown a simplified schematic representation, partly in section, of an automated method for continuously manufacturing a supply of RFID tags 181. For simplicity purposes only, the continuous supply of RFID tags 181 is shown without metallic reflector 151 and adhesive 155. However, it is to be understood that metallic reflector 151 and adhesive 155 could be introduced into the automated process in the same manner in which reflector 51 and adhesive 55 were introduced into the above-described method of manufacturing RFID tags 11.

In the process for manufacturing RFID tags 181, an extruder 185 generates a continuous extrudate 186 in the form of a rectangular block. A plurality of interconnected inlays 113 manufactured in the form of an RF inlay supply roll 163 are unwound from a reel 165 and laid on top of extrudate block 186.

With the plurality of interconnected inlays 113 deposited on top of extrudate block 186, a secondary extruder 187 generates a continuous plastic web 189 which is applied in-line over the interconnected inlays 113 and any exposed areas on top of extrudate block 186. In this manner, web 189 and extrudate block 186 cooperatively surround interconnected RF inlays 113.

It should be noted that web 189 may be affixed to extrudate block 186 using any one of a variety of different methods. As an example, web 189 may be hot when applied to extrudate block 186 to promote the adhesion therebetween. As another example, web 189 may be cool when initially applied to extrudate block 186 but then subsequently heated after said application step to promote the adhesion therebetween. As another example, web 189 may be affixed to extrudate block 186 using a conventional adhesive.

In the final steps of the assembly process, extrudate block 186 and web 189 (along with any reflectors 151 and adhesives 155 affixed thereto) are crimped between adjacent antennae 119 to fully enclose each antenna 119 and wireless communication device 121 between extrudate block 186 and web 189. After the crimping process, extrudate block 186 and web 189 (along with any reflectors 151 and adhesives 155 affixed thereto) are cut between adjacent antennae 119 to form the individual RFID tags 181. Sensors (not shown) located along the continuous assembly line may be used to locate antennae 119 during the crimping and cutting processes.

It should be noted that, although the process for fabricating tag 111 as described above includes, among other things, affixing web 189 to extrudate block 186 and then cutting the resulting assembly into individual tags, one could first cut block 186 and web 189 into respective pluralities of individual bottom members 183 and individual top members 127 and then affix the individual top members 127 to the individual bottom members 183.

Figure 12:
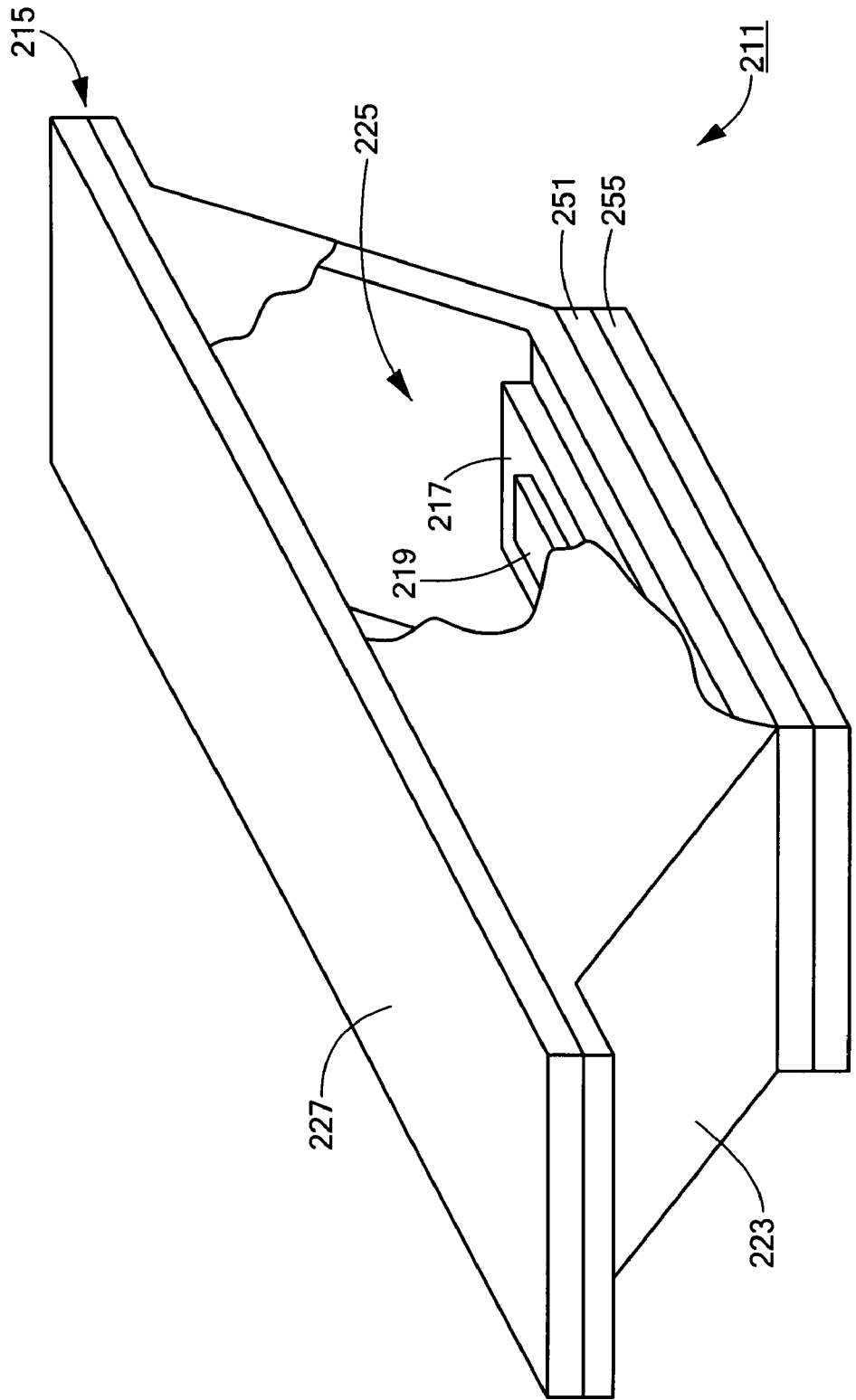
FIG. 12 is a perspective view of a fifth embodiment of an RFID tag constructed according to the teachings of the present invention, the bottom member of said tag being broken away in part to more clearly show the carrier sheet and antenna of the RF inlay.
Figure 13:
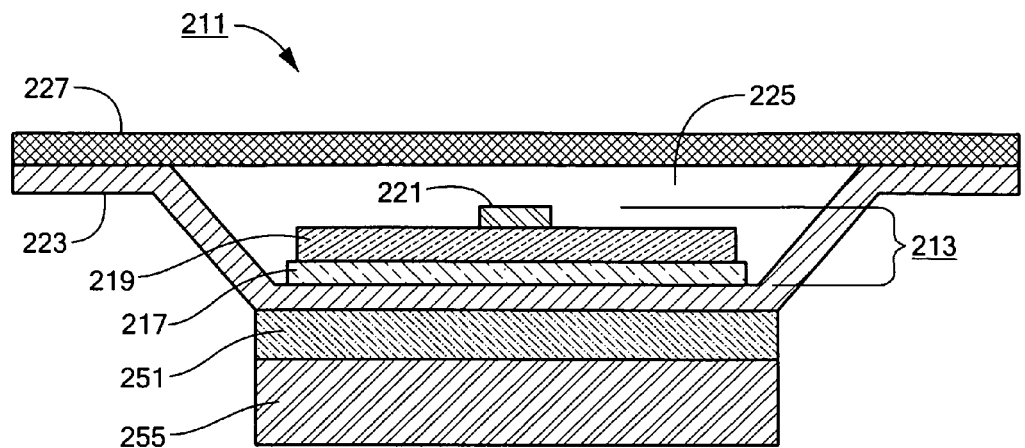
FIG. 13 is a longitudinal section view of the RFID tag shown in FIG. 12.

Referring now to FIGS. 12 and 13, there are shown perspective and section views, respectively, of a fourth embodiment of a radio frequency identification (RFID) tag constructed according to the teachings of the present invention and identified generally by reference numeral 211.

RFID tag 211 is similar in construction to RFID tag 111 in that RFID tag 211 comprises a radio frequency (RF) inlay 213 which is enclosed within a two-piece plastic casing 215.

RF inlay 213 is similar in construction to RF inlay 113 in that RF inlay 213 comprises a carrier sheet 217 preferably manufactured as a web of heat-stable polymeric film, an antenna 219 printed directly onto the top surface of carrier sheet 217 and a wireless communication device 221 conductively bonded to antenna 219.

Two-piece plastic casing 215 is similar in construction to casing 115 in that two-piece plastic casing 215 comprises a bottom member 223 shaped to define a cavity 225 and a top member 227 affixed to bottom member 223 over cavity 225. It should be noted that cavity 225 of bottom member 223 is sized and shaped to receive an individual RF inlay 213.

Two-piece plastic casing 215 differs from casing 115 in that bottom member 223 has a different shape that bottom member 113. Specifically, bottom member 223 is shaped such that cavity 225 extends only a portion of its length. More specifically, cavity 225 does not extend to either of the free ends of bottom member 223. Rather, cavity 225 only extends within the middle section of the length of bottom member 223. Due to the particular construction of bottom member 223, the securement of top member 227 onto bottom member 223 serves to completely enclose cavity 225 (with an RF inlay 213 disposed therein).

RFID tag 211 is similar to RFID tag 111 in that RFID tag 211 includes a metallic reflector 251 which is laminated onto the underside of bottom member 223 and a mounting adhesive 255 which is laminated onto the underside of metallic reflector 251. It should be noted that the application of metallic reflector 251 to the underside of bottom member 223 is optional and is only preferred when the item to which RFID tag 211 is to be secured is metallic in nature. Furthermore, it should be noted that, where it is not necessary of desirable to adhesively mount tag 211 onto an article, adhesive 255 is not needed and the lamination of mounting adhesive 255 onto the underside of metallic reflector 251 may be eliminated from the assembly process.

An automated method for continuously manufacturing a supply of RFID tags 211 may be accomplished in the following manner. An extruder generates a continuous extrudate strip which is substantially flat. In a subsequent thermoforming process, the continuous strip is provided with a plurality of equidistantly spaced, downwardly protruding projections, each projection being shaped to define a corresponding cavity 225. In this respect, the thermoforming process serves to provide the continuous strip with an egg-crate-type of construction.

After said thermoforming process, an individual RF inlay 213 is deposited in-line, by hand or machine, into an associated cavity 225 in the continuous strip. It should be noted that the supply of individual RF inlays 213 can be mass produced by printing a plurality of antennae 219 on a continuous web at spaced intervals, soldering a wireless communication device 221 onto each antenna 219 and cutting the continuous web between successive antennae 219 to define the individual RF inlays 213.

After said deposition step, a secondary extruder generates a continuous plastic web which is applied in-line to the top of the continuous strip. It should be noted that, by applying the plastic web onto the continuous strip, each cavity 225 becomes completely enclosed by casing 215. In this respect, each individual RF inlay 213 becomes encased on all sides within plastic casing 215.

It should be noted that the plastic web may be affixed to continuous strip using any one of variety of different methods. As an example, the plastic web may be hot when applied to the continuous strip to promote the adhesion therebetween. As another example, the plastic web may be cool when initially applied to the continuous strip but then subsequently heated after said application step to promote the adhesion therebetween. As another example, the plastic web may be affixed to the continuous strip using a conventional adhesive.

After said application step, the continuous strip and the plastic web are crimped (as deemed necessary) and cut between successive protrusions formed in the continuous strip to form the supply of individual RFID tags 211.

It should be noted that metallic reflector 251 and/or adhesive 255, if required, could be laminated (directly or indirectly) onto bottom member 223 prior to said cutting step (in a similar manner in which reflector 51 and adhesive 55 are continuously in-line laminated onto extrudate 15) or after said cutting step (e.g., through manual application).

It should also be noted that, although the process for fabricating tag 211 as described above includes, among other things, affixing the web of top members 227 to the strip of bottom members 223 and then cutting the resulting assembly into individual tags, one could first cut the web of top members 227 and the strip of bottom members 223 into respective pluralities of individual top members 227 and individual bottom members 223 and then affix the individual top members 227 to the individual bottom members 223.

Figure 14:
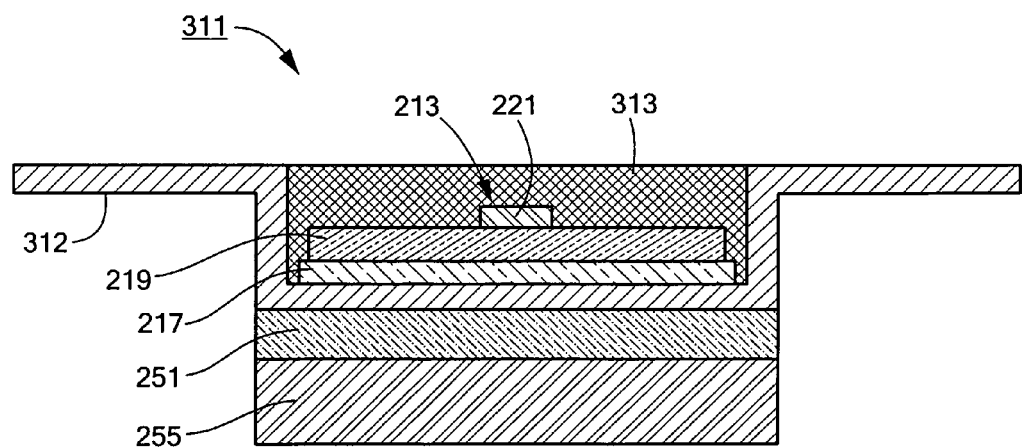
FIG. 14 is a longitudinal section view of a sixth embodiment of an RFID tag constructed according to the teachings of the present invention.

Referring now to FIG. 14, there is shown a section view of a fifth embodiment of a radio frequency identification (RFID) tag constructed according to the teachings of the present invention and identified generally by reference numeral 311.

Tag 311 is similar in many respects to tag 211, the principal differences between the two tags being that tag 311 has a bottom member 312, instead of bottom member 223, and that tag 311 includes a plug 313, instead of top member 227. Plug 313 is positioned directly on top of inlay 213 and occupies some or all of the remaining space within bottom member 312. Plug 313 is similar in composition to plug 177 of tag 171 and may be formed in the same manner as plug 177.

It should be noted that individual members 312 may be formed by cutting a strip of interconnected bottom members 312 and that plug 313 may be formed prior to the cutting of said strip of interconnected bottom members 312 into individual bottom members 312 or after the cutting of said strip of interconnected bottom members 312 into individual bottom members 312.

The embodiments shown in the present invention are intended to be merely exemplary and those skilled in the art shall be able to make numerous variations and modifications to it without departing from the spirit of the present invention. All such variations and modifications are intended to be within the scope of the present invention as defined in the appended claims.

What is claimed is:

1. A tag comprising:
    (a) an inlay, said inlay comprising
        (i) an antenna, and
        (ii) a wireless communication device coupled to said antenna; and
    (b) a plastic extrudate, said plastic extrudate being a monolithic one-piece member, with said antenna and said wireless communication device being embedded within said plastic extrudate.

2. The tag as claimed in claim 1 wherein said wireless communication device is a radio frequency (RF) communication device.

3. The tag as claimed in claim 1 wherein said inlay further comprises a carrier sheet, said antenna being printed onto said carrier sheet.

4. A tag comprising:
    (a) an inlay, said inlay comprising
        (i) an antenna, and
        (ii) a wireless communication device coupled to said antenna;
    (b) a plastic extrudate, said plastic extrudate encapsulating said antenna and said wireless communication device; and
    (c) a metallic reflector coupled to said plastic extrudate.

5. The tag as claimed in claim 1 further comprising a mounting adhesive coupled to said plastic extrudate.

6. The tag as claimed in claim 1 wherein said wireless communication device is in the form of an integrated circuit (IC) chip which is conductively bonded to said antenna.

7. The tag as claimed in claim 1 wherein said antenna is a bilaterally symmetrical dipole antenna.

8. The A tag comprising:
(a) an inlay, said inlay comprising
   (i) an antenna,
   (ii) a wireless communication device coupled to said antenna, and
   (iii) a carrier sheet, said antenna being disposed on said carrier sheet, and
(b) a plastic extrudate, wherein said plastic extrudate comprises a top plastic extrudate member and a bottom plastic extrudate member, the bottom plastic extrudate member being shaped to include a cavity adapted to receive said antenna and said wireless communication device, wherein said top plastic extrudate member and said bottom plastic extrudate member cooperatively encapsulate said antenna and said wireless communication device.

9. A method of continuously manufacturing a plurality of tags, each tag comprising a plastic extrudate and an inlay surrounded by said plastic extrudate, said method comprising the steps of:
(a) providing a continuous supply of inlays, said continuous supply of inlays comprising a continuous carrier web, a plurality of antennae positioned on said continuous carrier web at spaced intervals and a wireless communication device coupled to each of said antennae,
(b) feeding said continuous supply of inlays into a crosshead extruder so as to yield a continuous block which includes said continuous supply of inlays surrounded by a plastic extrudate, and
(c) cutting said continuous block between successive antennae so as to yield individual tags.

10. The method of claim 9 further comprising the step of coupling a mounting adhesive to the underside of said continuous block.

11. A tag comprising:
(a) a plastic casing comprising
   (i) a bottom member shaped to define a longitudinal cavity, and
   (ii) a top member applied to said bottom member to at least partially enclose the longitudinal cavity, and
(b) an inlay disposed within the longitudinal cavity, said inlay comprising,
   (i) a carrier sheet,
   (ii) an antenna disposed on said carrier sheet, and
   (iii) a wireless communication device coupled to said antenna.

12. The tag as claimed in claim 11 wherein said wireless communication device is a radio frequency (RF) communication device.

13. The tag as claimed in claim 11 wherein said antenna is printed onto said carrier sheet.

14. The tag as claimed in claim 11 further comprising a mounting adhesive coupled to said plastic casing.

15. The tag as claimed in claim 11 wherein said wireless communication device is in the form of an integrated circuit (IC) chip which is conductively bonded to said antenna.

16. The tag as claimed in claim 11 wherein the longitudinal cavity extends the entire length of said bottom member.

17. The tag as claimed in claim 16 wherein the longitudinal cavity is generally U-shaped in longitudinal cross-section.

18. The tag as claimed in claim 11 wherein the top member is a flat sheet affixed to said bottom member.

19. The tag as claimed in claim 11 wherein the longitudinal cavity extends only a portion of the length of said bottom member.

20. The tag as claimed in claim 19 wherein the longitudinal cavity is spaced inwardly from both ends of said bottom member.

21. A tag comprising:
(a) a plastic casing comprising
   (i) a bottom member shaped to define a longitudinal cavity, and
   (ii) a top member applied to said bottom member to at least partially enclose the longitudinal cavity, wherein the top member is a plug molded to said bottom member; and
(b) an inlay disposed within the longitudinal cavity, said inlay comprising,
   (i) a carrier sheet,
   (ii) an antenna disposed on said carrier sheet, and
   (iii) a wireless communication device coupled to said antenna.

* * * * *